United States Patent
Hoshino et al.

(10) Patent No.: US 8,048,780 B2
(45) Date of Patent: Nov. 1, 2011

(54) METHOD OF PROCESSING OPTICAL DEVICE WAFER

(75) Inventors: Hitoshi Hoshino, Ota-ku (JP); Takashi Yamaguchi, Ota-ku (JP)

(73) Assignee: Disco Corporation, Tokyo (JP)

( * ) Notice: Subject to any disclaimer, the term of this patent is extended or adjusted under 35 U.S.C. 154(b) by 209 days.

(21) Appl. No.: 12/497,877

(22) Filed: Jul. 6, 2009

(65) Prior Publication Data

US 2010/0041210 A1   Feb. 18, 2010

(30) Foreign Application Priority Data

Aug. 12, 2008 (JP) ................................. 2008-207688

(51) Int. Cl.
*H01L 21/302* (2006.01)

(52) U.S. Cl. ........ 438/463; 438/464; 438/458; 438/459; 438/68

(58) Field of Classification Search .................. 438/458, 438/459, 463, 464, 33, 68
See application file for complete search history.

(56) References Cited

U.S. PATENT DOCUMENTS

| | | | |
|---|---|---|---|
| 7,601,616 B2 | 10/2009 | Morikazu et al. | |
| 7,622,366 B2 | 11/2009 | Nakamura | |
| 7,745,311 B2 | 6/2010 | Hoshino et al. | |
| 2005/0009301 A1 | 1/2005 | Nagai et al. | |
| 2006/0003553 A1 | 1/2006 | Park et al. | |
| 2009/0124063 A1 | 5/2009 | Nakamura | |
| 2009/0142906 A1 | 6/2009 | Nakamura | |
| 2009/0197395 A1 | 8/2009 | Nakamura et al. | |
| 2009/0215245 A1 | 8/2009 | Nakamura | |
| 2009/0298263 A1 | 12/2009 | Watanabe et al. | |
| 2009/0311848 A1 | 12/2009 | Hoshino et al. | |
| 2010/0035408 A1 | 2/2010 | Hoshino et al. | |
| 2010/0041210 A1 | 2/2010 | Hoshino et al. | |

FOREIGN PATENT DOCUMENTS

| | | |
|---|---|---|
| JP | A 10-305420 | 11/1998 |
| JP | A 2008-6492 | 1/2008 |

OTHER PUBLICATIONS

Office Action issued by the United States Patent and Trademark Office of U.S. Appl. No. 12/496,436, mailed Dec. 21, 2010 (includes obviousness-type double patenting rejection based on present Application).

*Primary Examiner* — Zandra Smith
*Assistant Examiner* — Paul E Patton
(74) *Attorney, Agent, or Firm* — Greer, Burns & Crain, Ltd.

(57) ABSTRACT

A method of dividing an optical device wafer includes: a laser beam processing step of performing laser beam processing on the face side of an optical device wafer so as to form breakage starting points along streets; a protective plate bonding step of bonding the face side of the optical device wafer to a surface of a highly rigid protective plate with a bonding agent permitting peeling; a back side grinding step of grinding the back side of the optical device wafer so as to form the optical device wafer to a finished thickness of optical devices; a dicing tape adhering step of adhering the back-side surface of the optical device wafer to a dicing tape; a cut groove forming step of cutting the protective plate bonded to the optical device wafer along the streets so as to form cut grooves; and a wafer dividing step of exerting an external force on the optical device wafer through the protective plate, so as to break up the optical device wafer along the breakage starting points formed along the streets, thereby dividing the optical device wafer into the individual optical devices.

3 Claims, 15 Drawing Sheets

METHOD OF PROCESSING OPTICAL DEVICE WAFER

BACKGROUND OF THE INVENTION

1. Field of the Invention

The present invention relates to a method of processing an optical device wafer by which an optical device wafer having optical devices composed of a gallium nitride compound semiconductor or the like layered in a plurality of regions demarcated by streets formed in a grid pattern on the face-side surface of a substrate such as a sapphire substrate is divided along the streets into the individual optical devices.

2. Description of the Related Art

An optical device wafer in which a plurality of regions are demarcated by planned dividing lines called streets formed in a grid pattern on the face-side surface of a sapphire substrate and optical devices composed of a gallium nitride compound semiconductor or the like are layered in the demarcated regions is divided along the streets into the individual optical devices such as light emitting diodes, which are widely utilized for electric apparatuses. As a method for dividing the optical device wafer along the streets, a method of cutting the optical device wafer by a cutting blade rotated at high speed has been attempted, but it is difficult to cut the sapphire substrate by a cutter, since the sapphire substrate has a high Mohs hardness and is a difficult-to-cut material.

In recent years, as a method for dividing a wafer such as an optical device wafer along streets, there has been proposed a method in which the wafer is irradiated with a pulsed laser beam having such a wavelength as to be absorbed in the wafer along the streets to form laser beam-machined grooves, and an external force is applied along the laser beam-machined grooves so as to break up the wafer along the streets (see, for example, Japanese Patent Laid-open No. Hei 10-305420).

In addition, as a method for dividing a wafer such as an optical device wafer along streets, there has also been proposed a method in which the wafer is irradiated with a pulsed laser beam having such a wavelength as to be transmitted through the wafer along the streets while adjusting the focal point position of the pulsed laser beam to the inside of the wafer, thereby continuously forming an altered layer inside the wafer along the streets, and an external force is exerted along the streets along which the wafer strength has been lowered due to the formation of the altered layer, to break up the wafer along the streets (see, for example, Japanese Patent Laid-open No. 2008-6492).

The optical device wafer as above-mentioned is formed to a predetermined thickness by grinding the back side thereof, prior to division into the individual devices. Besides, in recent years, a reduction of the thickness of optical devices to 50 μm or below is demanded for realizing electric apparatuses reduced in weight and size. When an optical device wafer is ground to a small thickness of 50 μm or below, however, the optical device wafer would be cracked.

SUMMARY OF THE INVENTION

Accordingly, it is an object of the present invention to provide a method of processing an optical device wafer by which an optical device wafer can be thinned, without generation of cracks, and can be divided into individual optical devices.

In accordance with an aspect of the present invention, there is provided a method of processing an optical device wafer, for dividing an optical device wafer which has optical devices formed in a plurality of regions demarcated by a plurality of streets formed in a grid pattern on a face-side surface thereof, along the plurality of streets into the individual optical devices, the method including: a laser beam processing step of irradiating the optical device wafer with a laser beam along the streets so as to perform laser beam processing on the face side of the optical device wafer, thereby forming breakage starting points along the streets; a protective plate bonding step of bonding the face side of the optical device wafer having been subjected to the laser beam processing step to a surface of a rigid protective plate with a bonding agent permitting peeling; a back side grinding step of grinding a back side of the optical device wafer adhered to the protective plate to form the optical device wafer to a finished thickness of the optical devices; a dicing tape adhering step of adhering the back-side surface of the optical device wafer having been subjected to the back side grinding step to a surface of a dicing tape; a cut groove forming step of cutting the protective plate bonded to the face side of the optical device wafer having been subjected to the dicing tape adhering step, along the streets formed on the optical device wafer, thereby to form cut grooves not reaching the face-side surface of the optical device wafer; a wafer dividing step of exerting an external force on the optical device wafer through the protective plate having been subjected to the cut groove forming step, so as to break up the optical device wafer along the breakage starting points formed along the streets, thereby dividing the optical device wafer into the individual optical devices; a protective plate peeling step of peeling the protective plate bonded to the face side of the optical device wafer having been subjected to the wafer dividing step; and a picking-up step of picking up the individually divided optical devices adhered to the dicing tape.

Preferably, the laser beam processing step includes irradiating the optical device wafer with a laser beam having such a wavelength as to be transmitted through the optical device wafer while adjusting a focal point position of the laser beam to the inside of the optical device wafer, thereby to form an altered layer as the breakage starting points inside the optical device wafer along the streets.

Alternatively, the laser beam processing step includes irradiating the optical device wafer with a laser beam having such a wavelength as to be absorbed in the optical device wafer, thereby to form laser beam-machined grooves as the breakage starting points in the face-side surface of the optical device wafer along the streets.

According to the present invention, the laser beam processing step of subjecting the optical device wafer to laser beam processing so as to form breakage starting points along the streets is carried out, the protective plate bonding step of bonding the face side of the optical device wafer to a surface of a highly rigid protective plate with a bonding agent permitting peeling is carried out, and thereafter the back grinding step of grinding the back side of the optical device wafer so as to form the optical device wafer to a finished thickness of the optical devices is carried out. Therefore, even when the optical device wafer is ground to a small thickness of, for example, 50 μm or below, the optical device wafer would not be cracked, since the highly rigid protective plate is bonded to the face side of the optical device wafer. The optical device wafer thus ground is broken up along the streets along which the breakage starting points have been formed, by exerting an external force on the optical device wafer through the protective plate, after execution of the cut groove forming step in which the protective plate bonded to the face side of the optical device wafer is cut along the streets formed on the optical device wafer so as to form the cut grooves not reaching the face-side surface of the optical device wafer. Therefore, the optical device wafer is divided into the individual optical devices, without damaging the optical devices.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
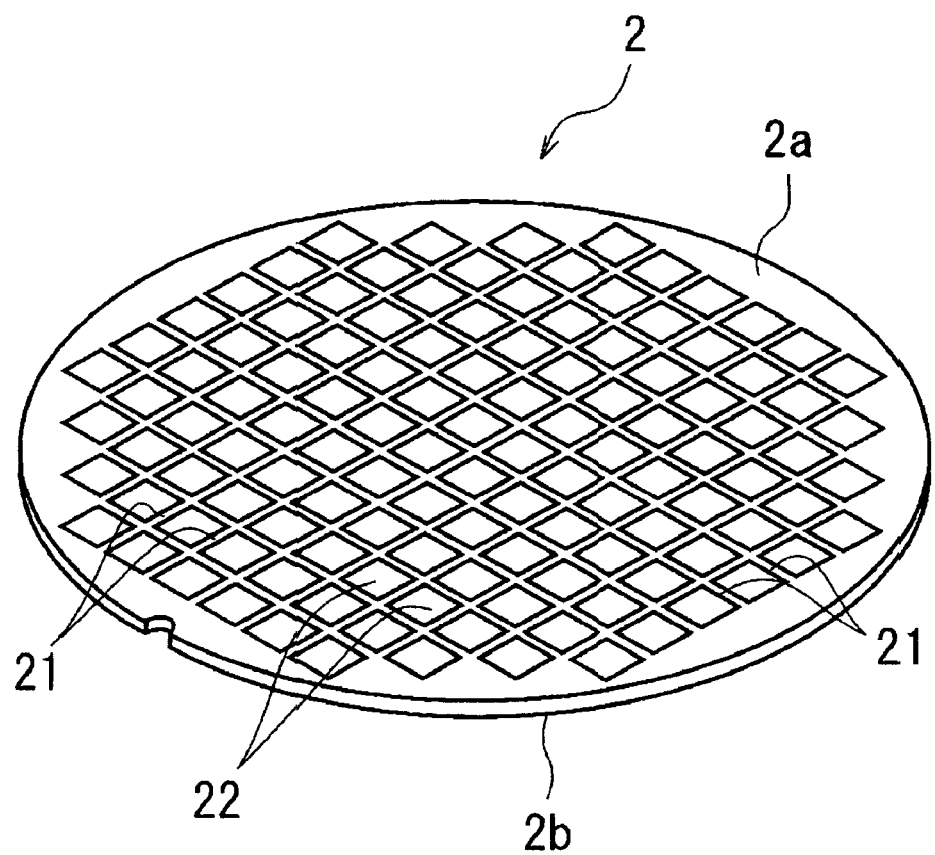
FIG. 1 is a perspective view of an optical device wafer to be divided by the method of processing an optical device wafer according to the present invention.

Now, preferred embodiments of the method of processing an optical device wafer according to the present invention will be described in detail below, referring to the attached drawings. FIG. 1 shows an optical device wafer 2 to be divided by the method of processing an optical device wafer according to the invention. The optical device wafer 2 shown in FIG. 1 has a configuration in which a plurality of regions are demarcated by streets 21 formed in a grid pattern on a face-side surface 2a of a sapphire substrate which, for example, has a diameter of 100 mm and a thickness of 425 μm, and a plurality of optical devices 22 such as light emitting diodes are formed in the demarcated regions.

A first embodiment of the method of processing an optical device wafer for dividing the above-mentioned optical device wafer 2 along the streets 21 into the individual optical devices 22 will be described, referring to FIGS. 2 to 12. In order to divide the optical device wafer 2 along the streets 21 into the individual optical devices 22, first, a laser beam processing step is conducted in which the optical device wafer 2 is irradiated with a laser beam along the streets 21 so as to perform laser beam processing on the optical device wafer 2, thereby forming breakage starting points along the streets 21. The laser beam processing step is carried out by use of a laser beam processing apparatus shown in FIG. 2. The laser beam processing apparatus 3 shown in FIG. 2 includes a chuck table 31 for holding a work to be machined, a laser beam irradiation means 32 for irradiating the work held on the chuck table 31 with a laser beam, and an image pickup means 33 for picking up an image of the work held on the chuck table 31. The chuck table 31 is so configured that it holds the work by suction, it is moved in a machining feed direction indicated by arrow X in FIG. 2 by a machining feeding means (not shown), and it is moved in an indexing feed direction indicated by arrow Y in FIG. 2 by an indexing feeding means (not shown).

The laser beam irradiation means 32 includes a hollow cylindrical casing 321 disposed substantially horizontally. In the casing 321 is disposed a pulsed laser beam oscillation means having a pulsed laser beam oscillator and a repetition frequency setting means (not shown). A condenser 322 for condensing a pulsed laser beam oscillated from the pulsed laser beam oscillator is mounted to a tip part of the casing 321.

The image pickup means 33 attached to a tip part of the casing 321 constituting the laser beam irradiation means 32, in the embodiment shown, is composed of not only an ordinary image pickup device (CCD) for imaging by use of a visible beam but also an infrared illumination means for irradiating the work with infrared rays, an optical system for catching the infrared rays radiated from the infrared illumination means, an image pickup device (infrared CCD) for outputting an electrical signal corresponding to the infrared rays caught by the optical system, and the like, and sends a picture signal indicative of the picked-up image to a control means (not shown).

Figure 2:
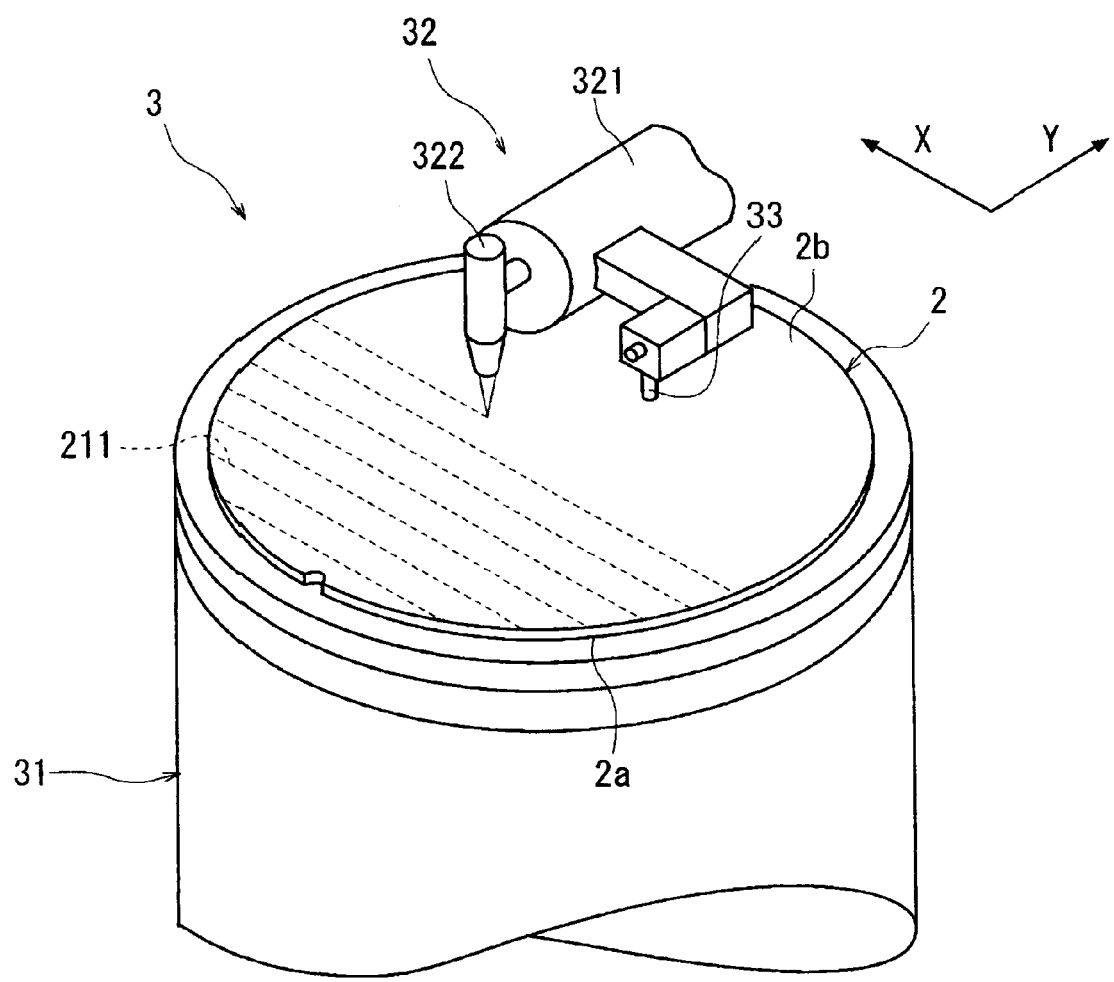
FIG. 2 is a perspective view of a major part of a laser beam processing apparatus for carrying out an altered layer forming step in a laser beam processing step in the method of processing an optical device wafer according to the invention.

Now, a laser beam processing step in which laser beam processing is applied to the optical device wafer 2 so as to form breakage starting points along the streets 21 by use of the above-mentioned laser beam processing apparatus 3 will be described below. A first embodiment of the laser beam processing step includes carrying out an altered layer forming step of forming an altered layer inside the optical device wafer 2 along the streets 21. To carry out the altered layer forming step, the optical device wafer 2 is put on the chuck table 31 of the laser beam processing apparatus 3, with its face-side surface 2a down, as shown in FIG. 2. Then, a suction means (not shown) is operated to suction hold the optical device wafer 2 onto the chuck table 31 (wafer holding step). Therefore, the optical device wafer 2 suction held on the chuck table 31 has its back-side surface 2b on the upper side.

After the wafer holding step is carried out as above-mentioned, an altered layer forming step is conducted in which the optical device wafer 2 is irradiated with a pulsed laser beam having such a wavelength as to be transmitted through the optical device wafer 2 from the back-side surface 2b side and along the streets 21 formed on the optical device wafer 2, thereby forming an altered layer inside the optical device wafer 2 along the streets 21. To carry out the altered layer forming step, first, the chuck table 31 with the optical device wafer 2 suction held thereon is positioned into a position just under the image pickup means 33 by a machining feeding means (not shown). Then, an alignment work is carried out in which a work region to be laser beam processed of the optical device wafer 2 is detected by the image pickup means 33 and the control means (not shown). Specifically, the image pickup means 33 and the control means (not shown) perform image processing such as pattern matching for matching the position of the street 21 formed on the optical device wafer 2 in a predetermined direction and the position of the condenser 322 of the laser beam irradiation means 32 for irradiation with the laser beam along the street 21, whereby alignment of the laser beam irradiation position is performed. In addition, alignment of the laser beam irradiation position is similarly performed also for the street 21 formed on the optical device wafer 2 to extend orthogonally to the predetermined direction (alignment step). In this case, the face-side surface 2a provided with the streets 21 of the optical device wafer 2 is located on the lower side. However, the image of the streets 21 can be picked up to the back-side surface 2b side in a see-through manner, since the image pickup means 33 has an image pickup means composed of the infrared illumination means, the optical system for catching infrared rays, the image pickup device (infrared CCD) for outputting an electrical signal corresponding to the infrared rays thus caught, and the like, as above-mentioned.

Figure 3A:
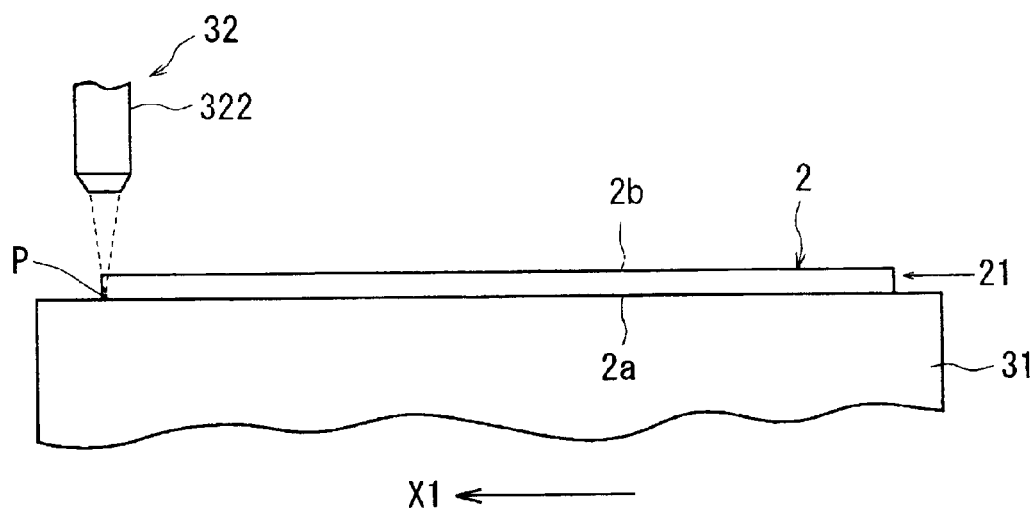
FIGS. 3A and 3B illustrate the altered layer forming step in the laser beam processing step in the method of dividing the optical device wafer according to the invention.
Figure 3B:
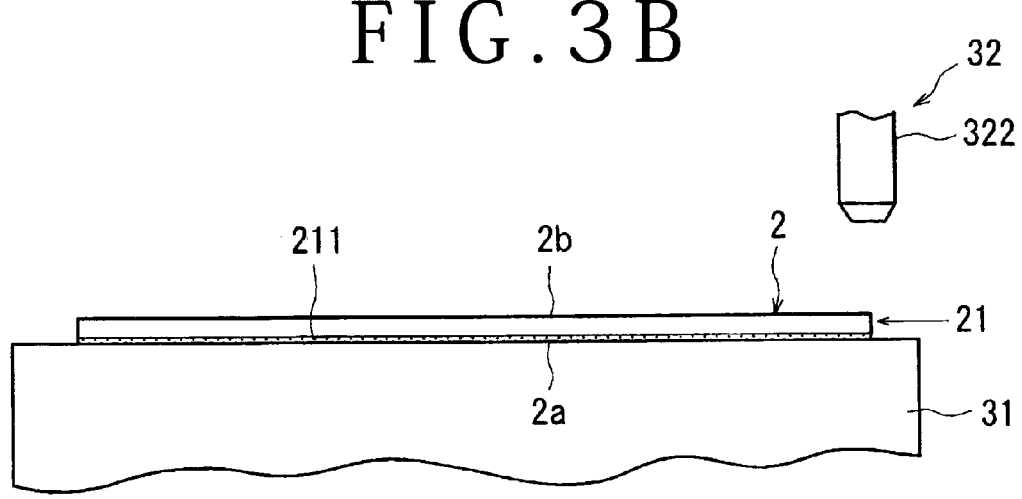

After the alignment step is conducted in this manner, the chuck table 31 is moved into a laser beam irradiation region in which the condenser 322 of the laser beam irradiation means 32 for irradiation with the laser beam is located, and one end (the left end, in FIG. 3A) of a predetermined street 21 is positioned into a position just under the condenser 322 of the laser beam irradiation means 32, as shown in FIG. 3A. Then, while irradiating the optical device wafer 2 with the pulsed laser beam having such a wavelength as to be transmitted through the optical device wafer 2 through the condenser 322, the chuck table 31 is moved at a predetermined feed rate in the direction of arrow X1 in FIG. 3A. Subsequently, when the irradiation position of the condenser 322 has reached the other end position of the street 21 as shown in FIG. 3B, the irradiation with the pulsed laser beam is stopped and the movement of the chuck table 31 is stopped. In the altered layer forming step, the condensing (converging) point P of the pulsed laser beam is positioned near the face-side surface 2a of the optical device wafer 2. As a result, an altered layer 211 is formed inside the optical device wafer 2, on the side of the face-side surface 2a, along the street 21.

The processing conditions in the altered layer forming step are set, for example, as follows.

| Light source: | Er pulsed laser |
|---|---|
| Wavelength: | 1560 nm |
| Repetition frequency: | 90 to 200 kHz |
| Mean output: | 0.8 to 1.2 W |
| Processing feed rate: | 100 to 300 mm/sec |

After the altered layer forming step has carried out along all the streets 21 extending in the predetermined direction of the optical device wafer 2, the chuck table 31 is turned by 90 degrees, and the altered layer forming step is carried out along each of the streets 21 extending orthogonally to the predetermined direction.

Figure 4:
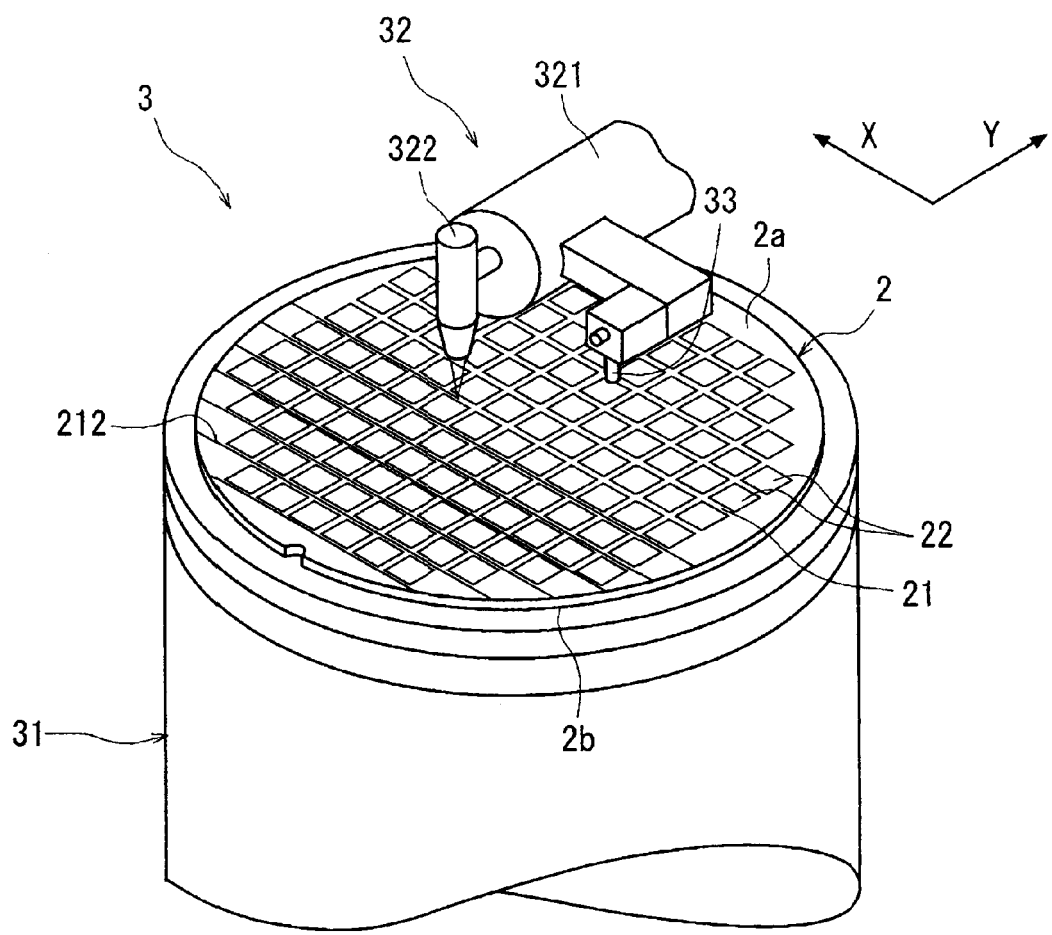
FIG. 4 is a perspective view of a major part of the laser beam processing apparatus for carrying a laser beam-machined groove forming step in the laser beam processing step in the method of processing an optical device wafer according to the invention.

Now, a second embodiment of the laser beam processing step for performing laser beam processing on the optical device wafer 2 to form the breakage starting points along the streets 21 will be described below, referring to FIGS. 4 to 5B. The second embodiment of the laser beam processing step includes performing a laser beam-machined groove forming step of forming laser beam-machined grooves in the face-side surface 2a of the optical device wafer 2 along the streets 21. Incidentally, the laser beam-machined groove forming step is carried out by use of a laser beam processing apparatus similar to the laser beam processing apparatus 3 shown in FIG. 2. To perform the laser beam-machined groove forming step, as shown in FIG. 4, the optical device wafer 2 is put on a chuck table 31 of the laser beam processing apparatus 3, with its back-side surface 2b down. Then, a suction means (not shown) is operated to hold the optical device wafer 2 onto the chuck table 31 by suction (wafer holding step). Therefore, the optical device wafer 2 suction held on the chuck table 31 has its face-side surface 2a on the upper side. After the wafer holding step is thus performed, an alignment step is carried out in the same manner as in the above-described altered layer forming step.

Figure 5A:
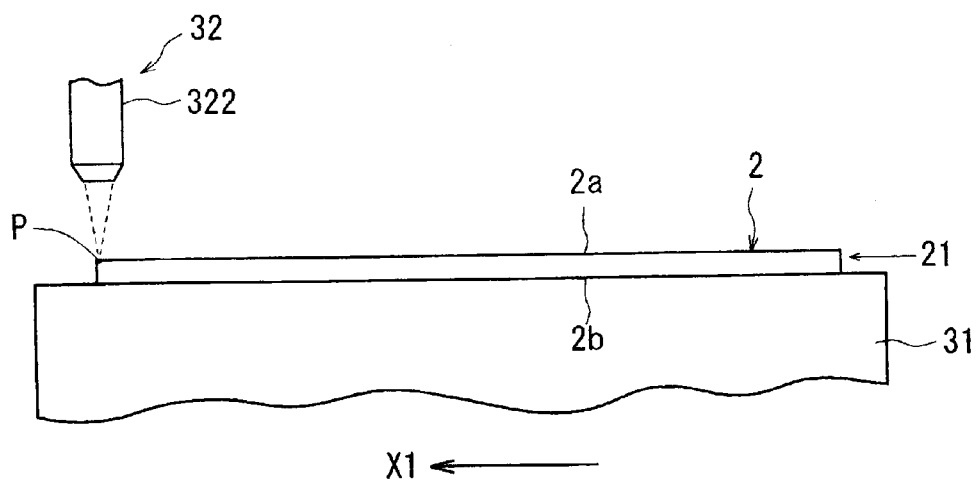
FIGS. 5A and 5B illustrate the laser beam-machined groove forming step in the laser beam processing step in the method of processing an optical device wafer according to the invention.
Figure 5B:
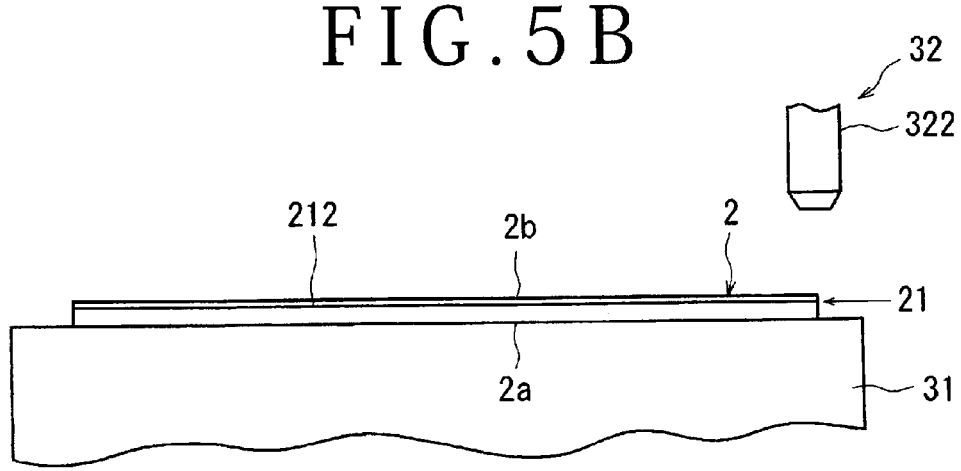

After the alignment step is conducted, the chuck table 31 is moved into a laser beam irradiation region in which a condenser 322 of a laser beam irradiation means 32 for irradiation with a laser beam is located, and one end (the left end, in FIG. 5A) of a predetermined street 21 is positioned into a position just under the condenser 322 of the laser beam irradiation means 32, as shown in FIG. 5A. Then, while irradiating the optical device wafer 2 with a pulsed laser beam having such a wavelength as to be absorbed in the optical device wafer 2 through the condenser 322, the chuck table 31 is moved at a predetermined feed rate in the direction of arrow X1 in FIG. 5A. Subsequently, when the irradiation position of the condenser 322 has reached the other end of the street 21 as shown in FIG. 5B, the irradiation with the pulsed laser beam is stopped and the movement of the chuck table 31 is stopped. In the laser beam-machined groove forming step, the condensing (converging) point P of the pulsed laser beam is positioned near the face-side surface 2a (upper surface) of the optical device wafer 2. As a result, a laser beam-machined groove 212 is formed in the face-side surface 2a of the optical device wafer 2 along the street 21.

The processing conditions in the laser beam-machined groove forming step as above are set, for example, as follows.

| Light source: | YAG pulsed laser |
|---|---|
| Wavelength: | 355 nm |
| Repetition frequency: | 90 to 200 kHz |
| Mean output: | 0.8 to 1.2 W |
| Processing feed rate: | 100 to 300 mm/sec |

After the laser beam-machined groove forming step is carried out along all the streets 21 extending in the predetermined direction of the optical device wafer 2, the chuck table 31 is turned by 90 degrees, and the laser beam-machined groove forming step is performed along each of the streets 21 extending orthogonally to the predetermined direction.

Figure 6A:
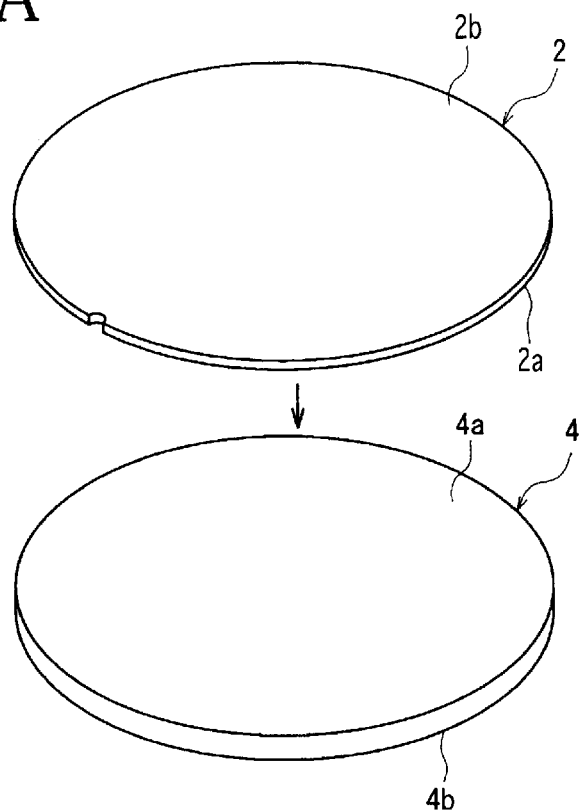
FIGS. 6A and 6B illustrate a protective plate bonding step in the method of processing an optical device wafer according to the invention.
Figure 6B:
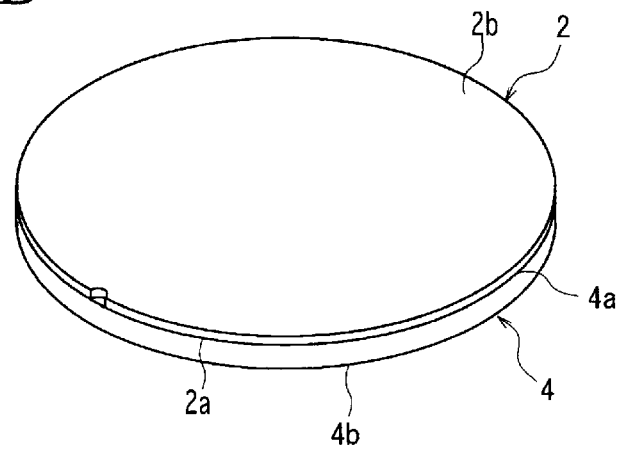
Figure 7:
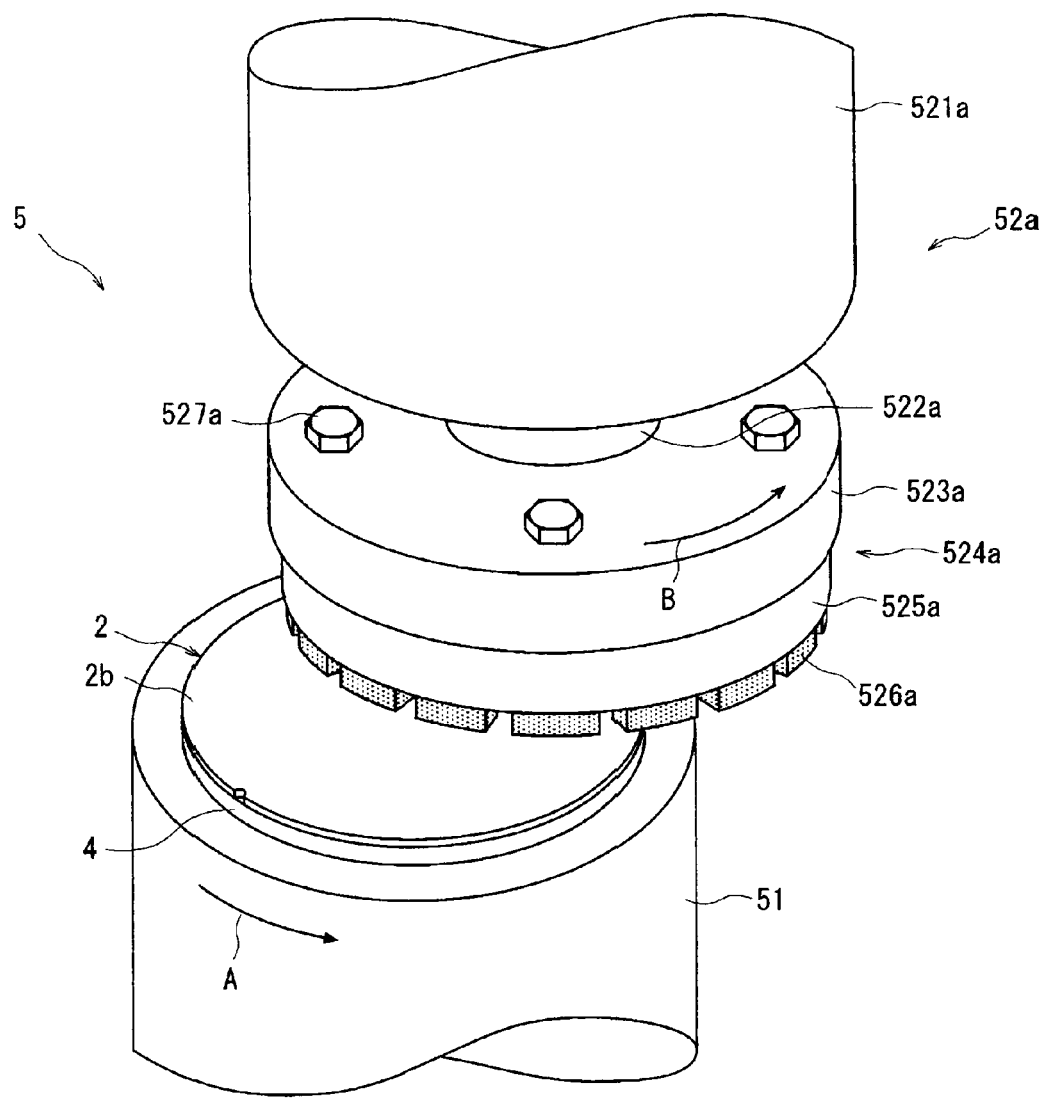
FIG. 7 illustrates a rough grinding step in a back side grinding step in the method of processing an optical device wafer according to the invention.

After the laser beam processing step as above is carried out, a protective plate bonding step is conducted in which the surface of the optical device wafer 2 is bonded to a surface of a highly rigid protective plate with a bonding agent permitting peeling. Specifically, as shown in FIGS. 6A and 6B, the face-side surface 2a of the optical device wafer 2 is bonded to the face-side surface 4a of the highly rigid protective plate 4 with a bonding agent permitting peeling. The protective plate 4 is formed in a circular disk shape from a high-rigidity material such as a glass substrate, with its face-side surface 4a and back-side surface 4b formed to be flat. Where the protective plate 4 is composed of a glass substrate, the thickness thereof is preferably about 0.5 mm. Incidentally, the material constituting the protective plate 4a is not limited to the glass substrate, and may be a ceramic, silicon, a resin or the like. Besides, as the bonding agent which permits peeling, there can be used a wax melting at a temperature of 70° C., for example.

After the protective plate bonding step as above is conducted, a back side grinding step is carried out in which the back-side surface 2b of the optical device wafer 2 adhered to the protective plate 4 is ground so as to form the optical device wafer 2 to a finished thickness of the optical devices. The back side grinding step, in the embodiment shown, is carried out by performing a rough grinding step and a finish grinding step. The rough grinding step is performed by use of a grinder shown in FIG. 7. The grinder 5 shown in FIG. 7 has a chuck table 51 for holding the work, and a rough grinding means 52a for rough grinding of a work surface of the work held on the chuck table 51. The chuck table 51 holds the work on its upper surface by suction, and is rotated in the direction of arrow A in FIG. 7. The rough grinding means 52a includes a spindle housing 521a, a rotating spindle 522a which is rotatably supported by the spindle housing 521a and is rotated by a rotational driving mechanism (not shown), a mounter 523a attached to the lower end of the rotating spindle 522a, and a rough grinding wheel 524a mounted to a lower surface of the mounter 523a. The rough grinding wheel 524a is composed of a circular disk-shaped base 525a, and a plurality of rough grinding stones 526a mounted to a lower surface of the base 525a in an annular pattern, and the base 525a is attached to the lower surface of the mounter 523a by fastening bolts 527a. The rough grinding stones 526a, in the embodiment shown, are each a metal-bonded grindstone formed by sintering diamond abrasive grains having a grain diameter of around ϕ60 μm with a metal bond.

To perform the rough grinding step by use of the above-mentioned grinder 5, the optical device wafer 2 having been subjected to the protective plate bonding step as above is placed on the upper surface (holding surface) of the chuck table 51, with its protective plate 4 side down, and the optical device wafer 2 is suction held onto the chuck table 51 through the protective plate 4. Therefore, the optical device wafer 2 suction held on the chuck table 51 through the protective plate 4 has its back-side surface 2b on the upper side. After the optical device wafer 2 is thus suction held on the chuck table 51, the chuck table 51 is rotated at, for example, 300 rpm in the direction of arrow A. While the chuck table 51 is being thus rotated, the rough grinding wheel 524a of the rough grinding means 52a is rotated at, for example, 1000 rpm in the direction of arrow B and is brought into contact with the back-side surface 2b of the optical device wafer 2, and the rough grinding wheel 524a is put to downward grinding feed at a grinding feed rate of, for example, 0.025 mm/min, whereby rough grinding of the back-side surface 2b of the optical device wafer 2 is performed. In this rough grinding step, grinding water is supplied to the grinding area; in this case, the quantity of the grinding water supplied may be about 4 L/min. Incidentally, the grinding amount in the rough grinding step, in the embodiment shown, is set to 345 μm. Therefore, the thickness of the optical device wafer 2 upon the rough grinding step, in the embodiment shown, is 80 μm.

Figure 8:
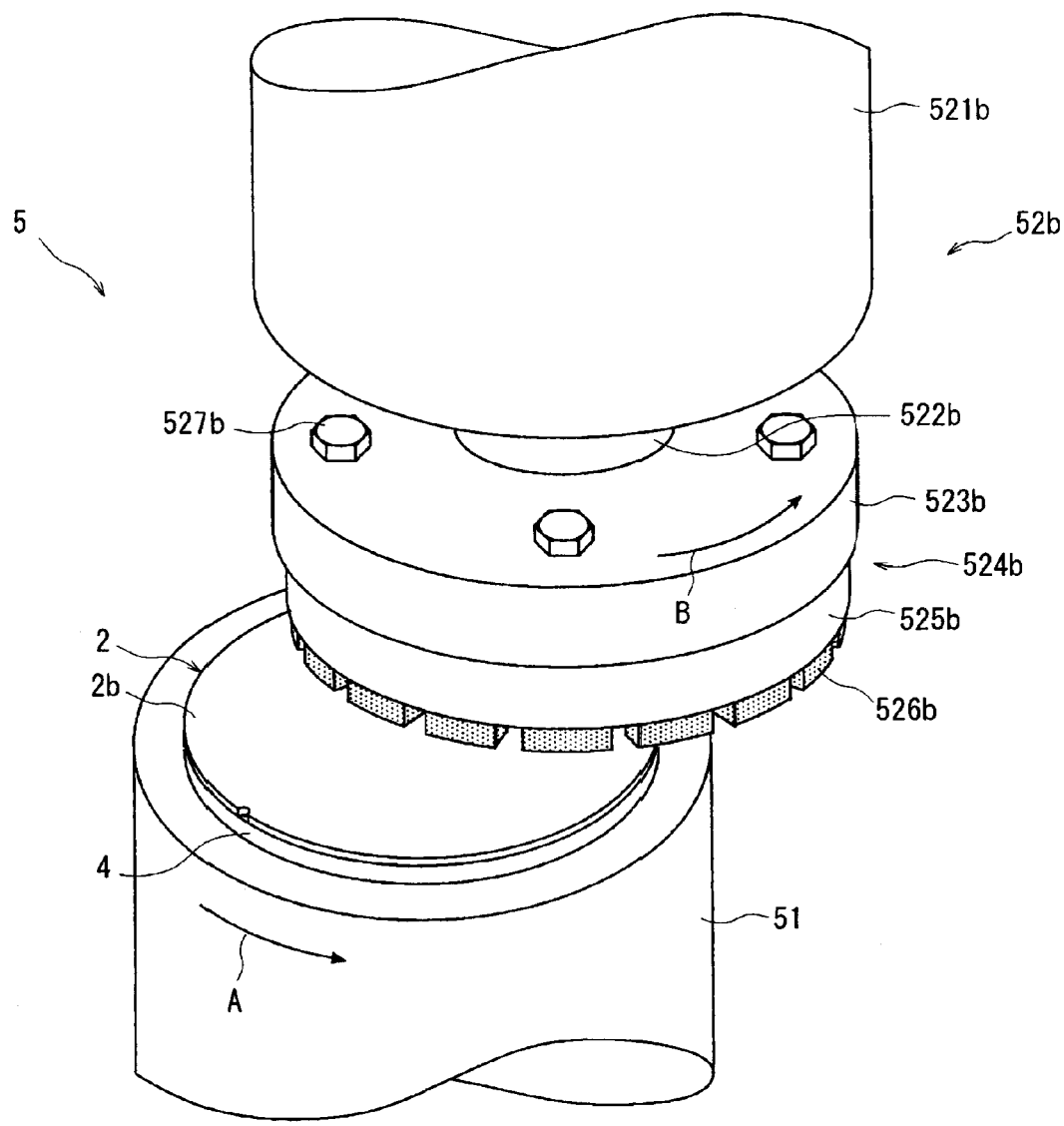
FIG. 8 illustrates a finish grinding step in the back side grinding step in the method of processing an optical device wafer according to the invention.

After the rough grinding step as above is conducted, a finish grinding step is carried out. As shown in FIG. 8, the finish grinding step is performed by use of a grinder 5 substantially the same as the grinder 5 shown in FIG. 7. Specifically, the grinder 5 shown in FIG. 8 has a chuck table 51, and a finish grinding means 52b for finish grinding of a work surface of the wafer held on the chuck table 51. The finish grinding means 52b includes a spindle housing 521b, a rotating spindle 522b which is rotatably supported by the spindle housing 521b and is rotated by a rotational driving mechanism (not shown), a mounter 523b attached to the lower end of the rotating spindle 522b, and a finish grinding wheel 524b mounted to a lower surface of the mounter 523b. The finish grinding wheel 524b includes a circular disk-shaped base 525b, and a plurality of finish grinding stones 526b mounted to a lower surface of the base 525b in an annular pattern, and the base 525b is attached to the lower surface of the mounter 523b by fastening bolts 527b. The finish grinding stones 526b, in the embodiment shown, are each composed of a resin-bonded grindstone obtained by sintering diamond abrasive grains having a grain diameter of around ϕ10 μm with a resin bond. The finish grinding means 52b thus configured is in general disposed in the same grinder as that for the rough grinding means 52a, and the chuck table 51 holding thereon the work rough-ground by the rough grinding means 52a is moved into the machining zone of the finish grinding means 52b.

Now, the finish grinding step carried out by use of the above-mentioned finish grinding means 52b will be described below referring to FIG. 8. The chuck table 51 holding thereon the optical device wafer 2 having been subjected to the rough grinding step by the rough grinding means 52a is moved into the machining zone of the finish grinding means 52b shown in FIG. 8. After the chuck table 51 is moved into the machining zone shown in FIG. 8, the chuck table 51 is rotated at, for example, 300 rpm in the direction of arrow A. While the chuck table 51 is thus being rotated, the finish grinding wheel 524b of the finish grinding means 52b is rotated at, for example, 1500 rpm and brought into contact with the back-side surface 2b of the optical device wafer 2, and the finish grinding wheel 524b is put to downward grinding feed at a grinding feed rate of, for example, 0.009 mm/min, whereby finish grinding of the back-side surface 2b of the optical device wafer 2 is performed. In this finish grinding step, grinding water is supplied to the grinding area; in this case, the quantity of the grinding water supplied may be about 4 L/min. Incidentally, the grinding amount in the finish grinding step, in the embodiment shown, is set to 55 μm. Therefore, the thickness of the optical device wafer 2 upon the finish grinding step, in the embodiment shown, is 25 μm.

The optical device wafer 2 having been subjected to the back side grinding step composed of the rough grinding step and the finish grinding step has an extremely small thickness of 25 μm, but it would not be cracked, since it is bonded to the highly rigid protective plate 4. Incidentally, it may be contemplated to carry out the above-mentioned laser beam processing step after the thickness of the optical device wafer 2 is reduced to the finished thickness of the optical devices by performing the above-mentioned back side grinding step. However, when the thickness of the optical device wafer 2 is reduced to an extremely small value of, for example, 25 μm, it is difficult, particularly in the altered layer forming step, to position the condensing (converging) point P of the laser beam in the inside of the optical device wafer 2. Therefore, the laser beam processing step is carried out in the condition where the optical device wafer 2 is thick, before performing the back side grinding step.

Figure 9:
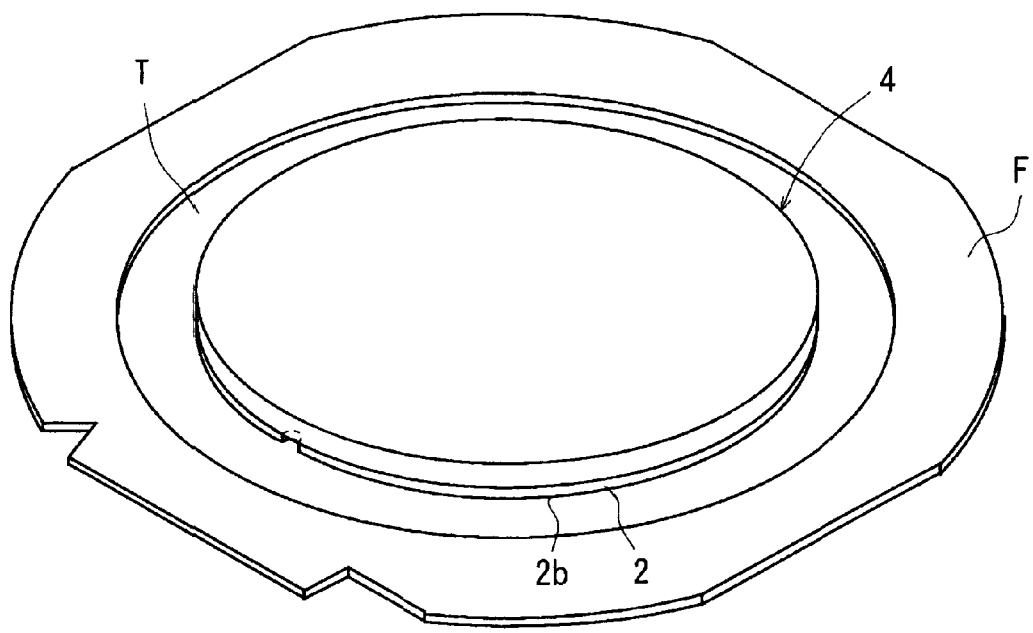
FIG. 9 illustrates a dicing tape adhering step in the method of processing an optical device wafer according to the invention.
Figure 10:
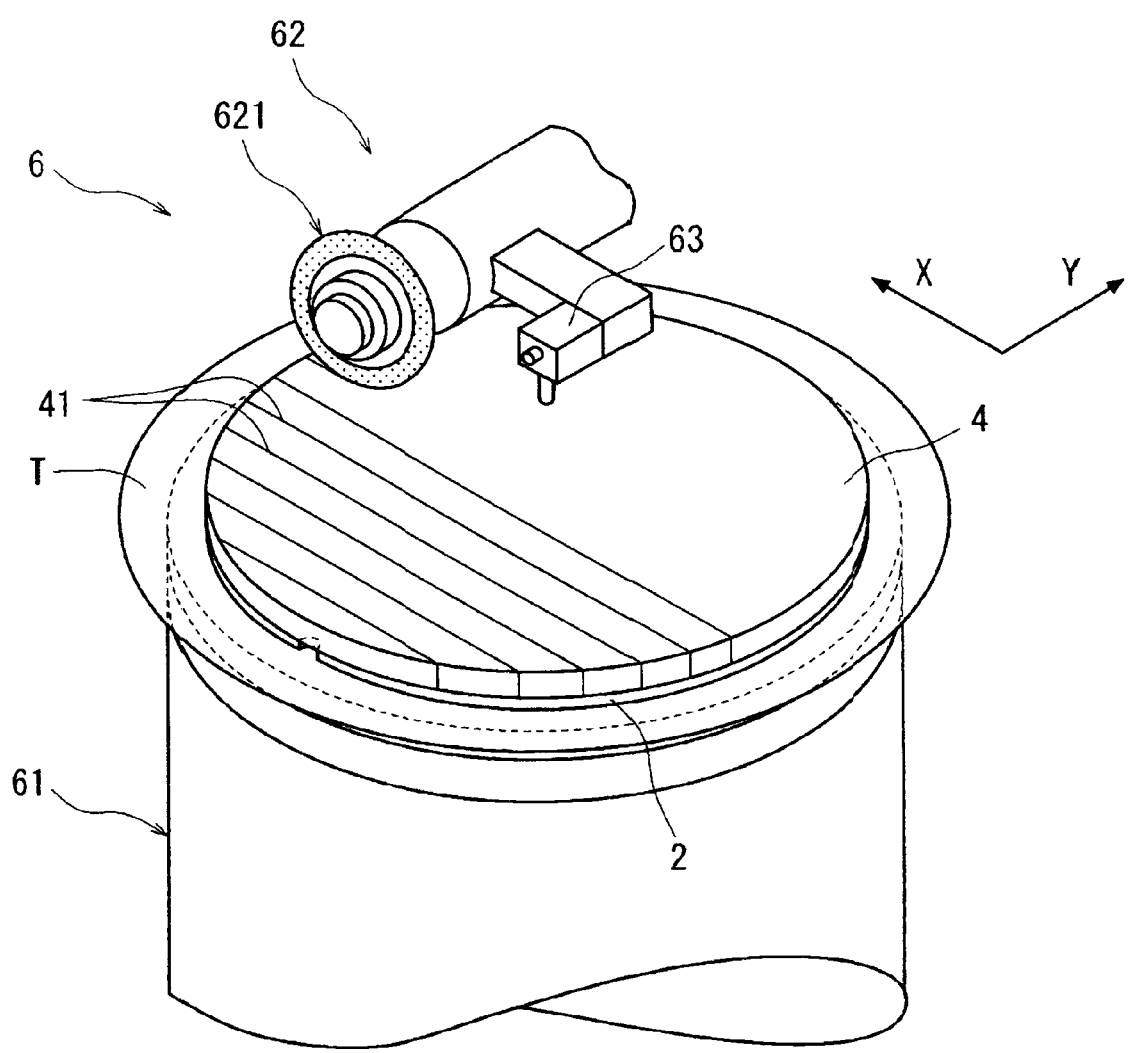
FIG. 10 is a perspective view of a major part of a cutting apparatus for carrying out a cut groove forming step in the method of processing an optical device wafer according to the invention.

After the above-mentioned back side grinding step is performed, a dicing tape adhering step is carried out in which the back-side surface of the optical device wafer 2 is adhered to a surface of a dicing tape. Specifically, as shown in FIG. 9, the back-side surface 2b of the optical device wafer 2 formed to the predetermined finished thickness by the back side grinding step is adhered to the surface of the dicing tape T attached to an annular frame F.

Next, a cut groove forming step is carried out in which the protective plate 4 bonded to the face-side surface 2a of the optical device wafer 2 having been subjected to the dicing tape adhering step is cut along the streets 21 formed on the optical device wafer 2, so as to form cut grooves not reaching the face-side surface 2a of the optical device wafer 2. The cut groove forming step is performed by use of a cutting apparatus 6 shown in FIG. 10. The cutting apparatus 6 shown in FIG. 10 includes a chuck table 61 for holding the work, a cutting means 62 having a cutting blade 621 for cutting the work held on the chuck table 61, and an image pickup means 63 for picking up an image of the work held on the chuck table 61. The chuck table 61 is rotated by a rotating mechanism (not shown), and is moved in a machining feed direction indicated by arrow X in FIG. 10 by a machining feeding mechanism (not shown). The cutting means 62 is moved in an indexing feed direction indicated by arrow Y in FIG. 10 by an indexing feeding mechanism (not shown). The cutting blade 621 is composed of a circular disk-shaped base, and an annular cutting edge attached to an outer peripheral portion of a side surface of the base, and the annular cutting edge is formed, for example, by fixing diamond abrasive grains having a grain diameter of about 3 µm through plating. The image pickup means 63 is composed of not only an ordinary image pickup device (CCD) for imaging by use of a visible beam but also an infrared illumination means for irradiating the work with infrared rays, an optical system for catching the infrared rays radiated by the infrared illumination means, an image pickup device (infrared CCD) for outputting an electrical signal corresponding to the infrared rays caught by the optical system, and the like. The image pickup means 63 sends a picture signal indicative of the picked-up image to a control means (not shown).

To perform the cut groove forming step by use of the cutting apparatus 6 configured as above, the optical device wafer 2 is mounted on the chuck table 61 so that the dicing tape T adhered thereto is on the lower side. Then, a suction means (not shown) is operated to thereby suction hold the optical device wafer 2 onto the chuck table 61 through the dicing tape T. Therefore, the protective plate 4 bonded to the face side of the optical device wafer 2 is on the upper side. Incidentally, while the annular frame F to which the dicing tape T is attached is omitted in FIG. 10, the annular frame F is fixed by appropriate frame-fixing clamps disposed on the chuck table 61.

After the optical device wafer 2 is thus held onto the chuck table 61 by suction, an alignment step is carried out in which a work region to be cut of the protective plate 4 bonded to the face side of the optical device wafer 2 is detected by the image pickup means 63 and the control means (not shown). Specifically, the image pickup means 63 and the control means (not shown) pick up an image of the street 21 formed on the optical device wafer 2 to extend in a predetermined direction, and carry out image processing such as pattern matching for matching the position of the street and the position of the cutting blade 621, whereby alignment of the cutting region is performed. In addition, alignment is similarly performed also for the street 21 extending in the direction orthogonal to the predetermined direction. In this case, the protective plate 4 is bonded to the face side of the optical device wafer 2 provided with the streets 21. However, the image of the streets 21 can be picked up through the protective plate 4 in a see-through manner, since the image pickup means 63 has an image pickup means composed of the infrared illumination mans, the optical system for catching infrared rays, the image pickup device (infrared CCD) for outputting an electrical signal corresponding to the infrared rays thus caught, and the like, as above-mentioned.

Figure 11A:
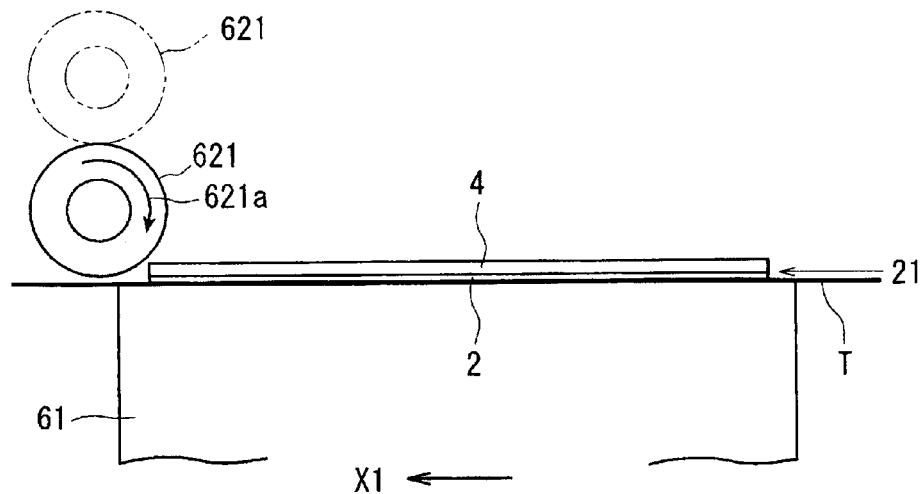
FIGS. 11A to 11C illustrate the cut groove forming step in the method of processing an optical device wafer according to the invention.

After the alignment of the cutting region of the protective plate 4 bonded to the face side of the optical device wafer 2 held on the chuck table 61 is conducted in this manner, the chuck table 61 holding the optical device wafer 2 with the protective plate 4 bonded thereto is moved to a cutting starting position. In this instance, as shown in FIG. 11A, the optical device wafer 2 is so positioned that one end (the left end in FIG. 11A) of a predetermined street 21 is located a predetermined amount to the right from the position just under the cutting blade 621. Then, the cutting blade 621 is rotated at a predetermined rotating speed in the direction of arrow 621a in FIG. 11A, and is put to cross feed (feed in the depth-of-cut direction), from a stand-by position indicated by two-dotted chain lines, downward by a predetermined amount as indicated by solid lines in FIG. 11A by a cross feed mechanism (not shown). The cross-fed position is so set that the outer peripheral edge of the cutting blade 621 reaches a position close to the lower surface of the protective plate 4, as shown in FIG. 11A.

Figure 11B:
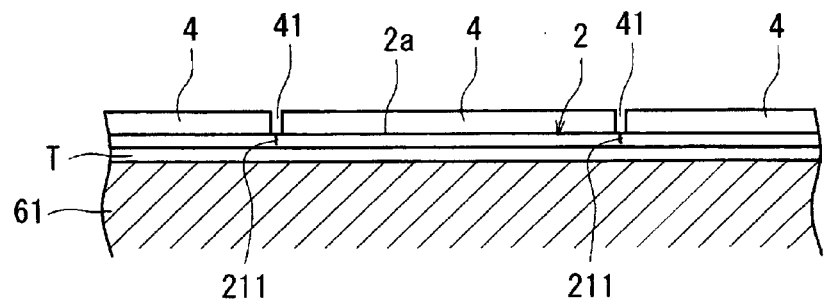
Figure 11C:
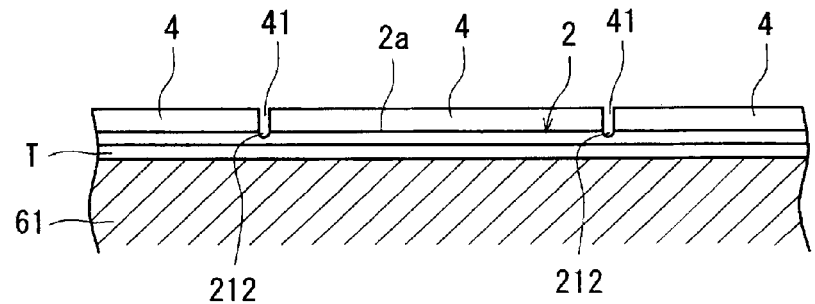

After the cross feed of the cutting blade 621 is carried out as above, the cutting blade 621 is kept in rotation at a predetermined rotating speed in the direction of arrow 621a in FIG. 11A, and the chuck table 61 is moved at a predetermined cutting feed rate in the direction of arrow X1 in FIG. 11A. Thereafter, when the right end of the protective plate 4 bonded to the face side of the optical device wafer 2 held on the chuck table 61 has passed through the position just under the cutting blade 621, the movement of the chuck table 61 is stopped. As a result, as shown in FIGS. 11B and 11C, a cut groove 41 is formed in the protective plate 4 along the street 21. Incidentally, FIG. 11B shows the case where the altered layer 211 has been formed inside the optical device wafer 2 on its face-side surface 2a side along the street 21 in the above-mentioned laser beam processing step, while FIG. 11C shows the case where the laser beam-machined groove 212 is formed in the face-side surface 2a of the optical device wafer 2 along the street 21 in the laser beam processing step.

After the cut groove forming step is carried out along all the streets 21 formed on the optical device wafer 2 to extend in the predetermined direction, the chuck table 61 is turned by 90 degrees, and the cut groove forming step is carried out along each of the streets 21 extending orthogonally to the predetermined direction.

Figure 12A:
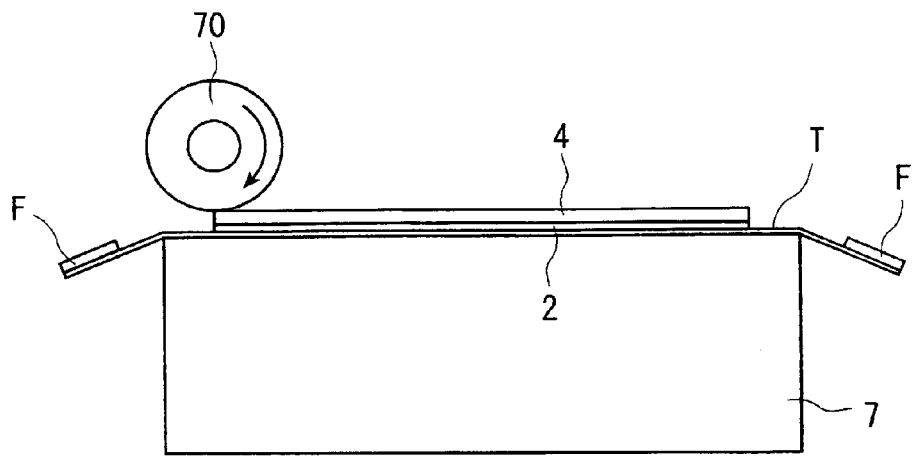
FIGS. 12A to 12C illustrate a wafer dividing step in the method of processing an optical device wafer according to the invention.
Figure 12B:
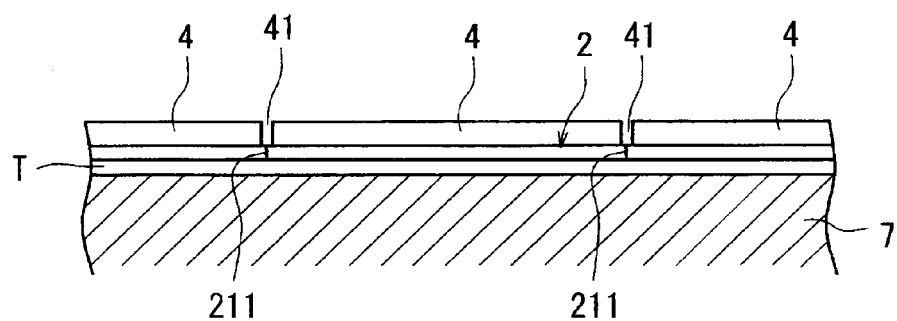
Figure 12C:
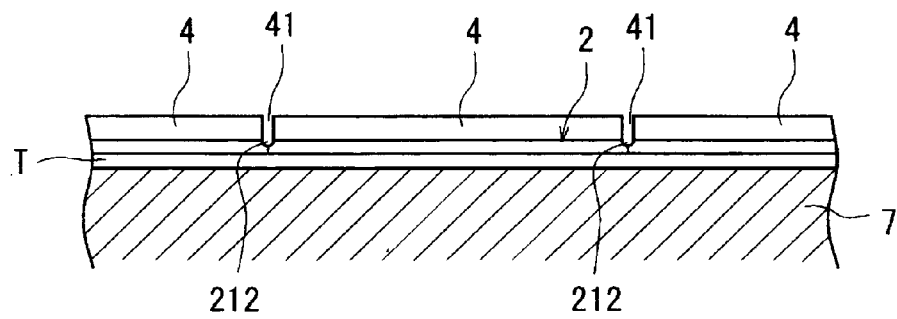

After the cut groove forming step is conducted, a wafer dividing step is carried out in which an external force is exerted on the optical device wafer 2 through the protective plate 4, so as to break up the optical device wafer 2 along the streets 21 along which the breakage starting points have been formed, thereby dividing the optical device wafer 2 into the individual optical devices 22. To perform the wafer dividing step, for example, as shown in FIG. 12A, the dicing tape T to which the back-side surface of the optical device wafer 2 (with the protective plate 4 bonded to the face side thereof) is adhered is mounted on a flexible rubber sheet 7. Therefore, the protective plate 4 bonded to the face side of the optical device wafer 2 adhered to the dicing tape T is on the upper side. Then, a pressure roller 70 is rolled on the upper surface of the protective plate 4 while pressing against the protective plate 4. As a result, an external force is exerted along the streets 21 of the optical device wafer 2 through the protective plate 4 formed with the cut grooves 41, and, as shown in FIGS. 12A and 12C, the optical device wafer 2 is broken up along the streets 21, with the altered layer 211 or the laser beam-machined grooves 212 functioning as the breakage starting points. Since the optical device wafer 2 is divided in the condition where the protective plate 4 is bonded to the face side thereof, the optical devices 22 would not be damaged during the division. Incidentally, since the back-side surfaces of the individually divided optical devices 22 remain adhered to the dicing tape T, the optical devices 22 would not be scattered, and the form of the optical device wafer 2 is maintained.

Figure 13A:
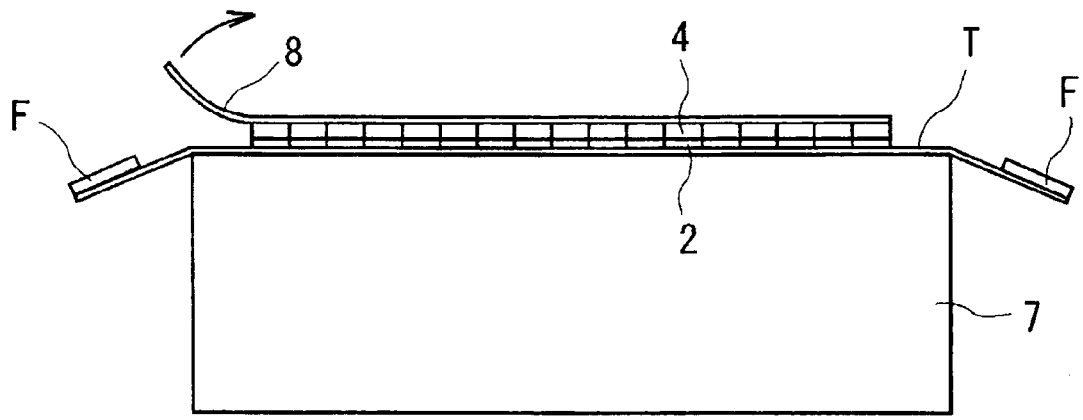
FIGS. 13A and 13B illustrate a protective plate peeling step in the method of processing an optical device wafer according to the invention.
Figure 13B:
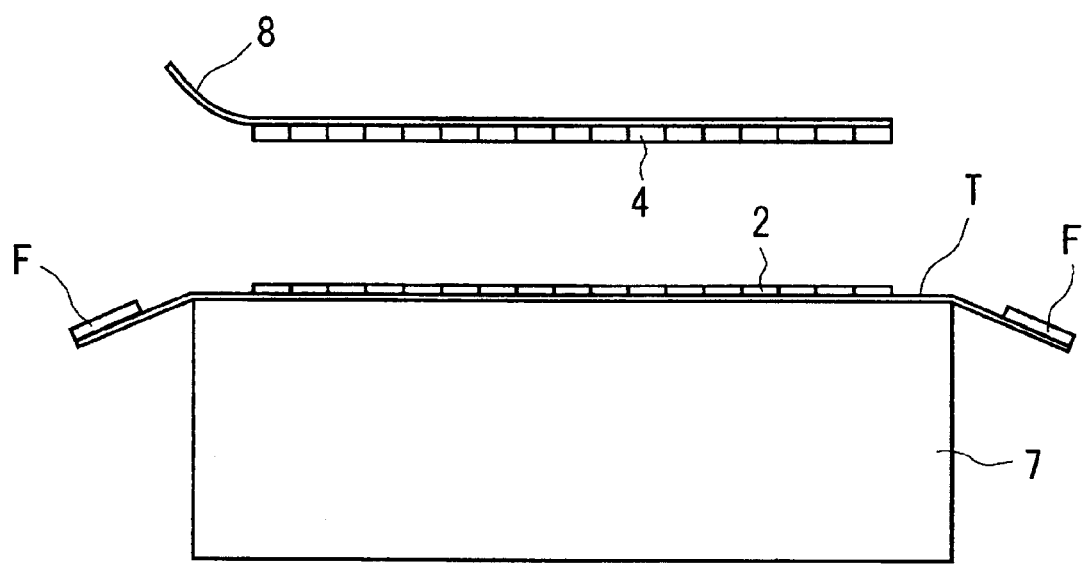

After the wafer dividing step as above is performed, a protective plate peeling step is carried out in which the protective plate 4 adhered to the face side of the optical device wafer 2 is peeled off. Incidentally, due to the cut groove forming step and the wafer dividing step as above, the protective plate 4 is in the state of having been divided correspondingly to the individual optical devices 22. In order to peel the divided pieces of the protective plate 4 at a time, therefore, for example, a peeling tape 8 is adhered to the upper surface of the protective plate 4 in the condition upon the wafer dividing step as shown in FIG. 13A, and the protective plate 4 as a whole is peeled from the face side of the optical device wafer 2 as shown in FIG. 13B. In this instance, since the wax bonding the optical device wafer 2 and the protective plate 4 to each other is melted by heating the protective plate 4 to about 70° C., the protective plate 4 can be easily peeled from the optical device wafer 2.

Figure 14:
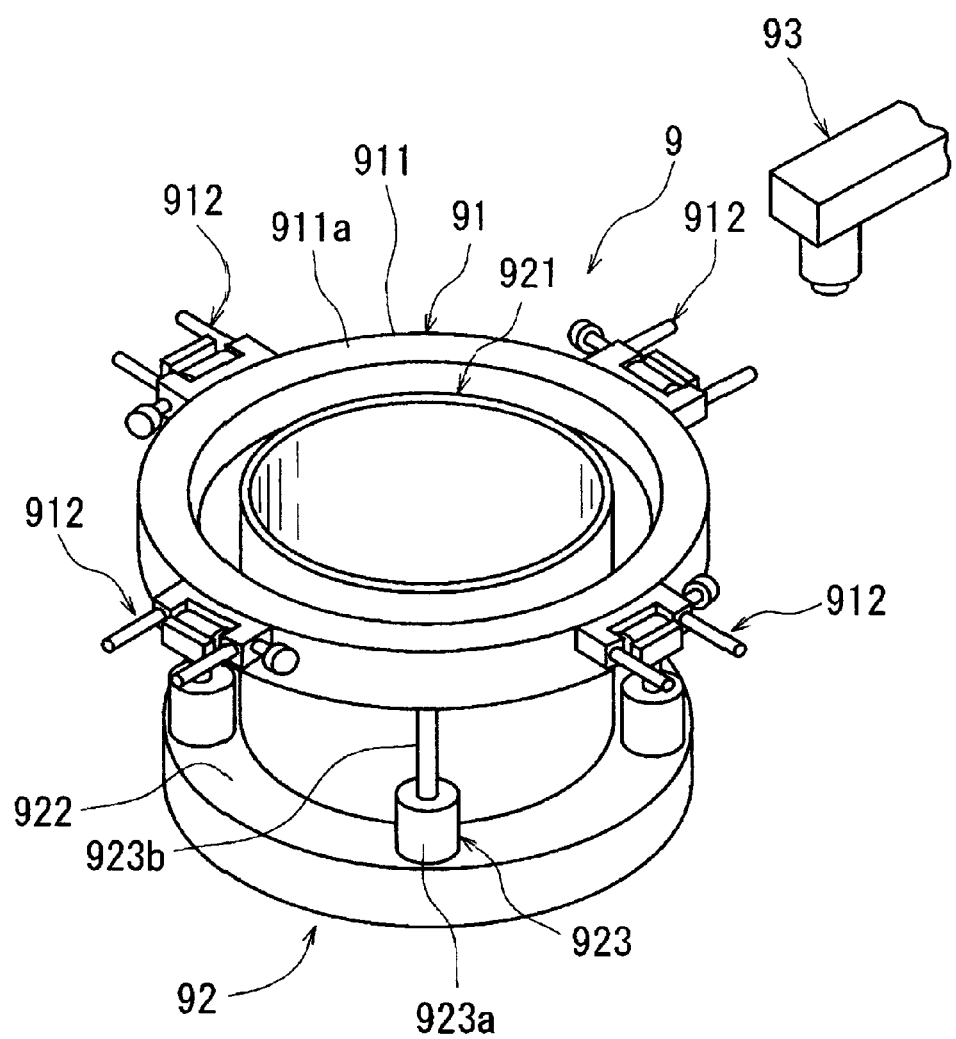
FIG. 14 is a perspective view of a pick-up device for carrying out a picking-up step in the method of processing an optical device wafer according to the invention.

After the above-mentioned protective plate peeling step is conducted, a picking-up step is carried out in which the individually divided optical devices 22 adhered to the dicing tape T are picked up by peeling them from the dicing tape T. This picking-up step is performed by use of a picking-up device 9 shown in FIG. 14. The picking-up device 9 shown in FIG. 14 includes a frame holding means 91 for holding the annular frame F, a tape expanding means 92 for expanding the dicing tape T attached to the annular frame F held by the frame holding means 91, and a pick-up collet 93. The frame holding means 91 is composed of an annular frame holding member 911, and a plurality of clamps 912 as fixing means disposed at the outer periphery of the frame holding member 911. An upper surface of the frame holding member forms a mount surface 911a on which to mount the annular frame F, and the annular frame F is mounted on the mount surface 911a. Then, the annular frame F mounted on the mount surface 911a is fixed to the frame holding member 911 by the clamps 912. The frame holding means 91 configured in this manner is so supported that it can be advanced and retracted in the vertical direction by the tape expanding means 92.

Figure 15A:
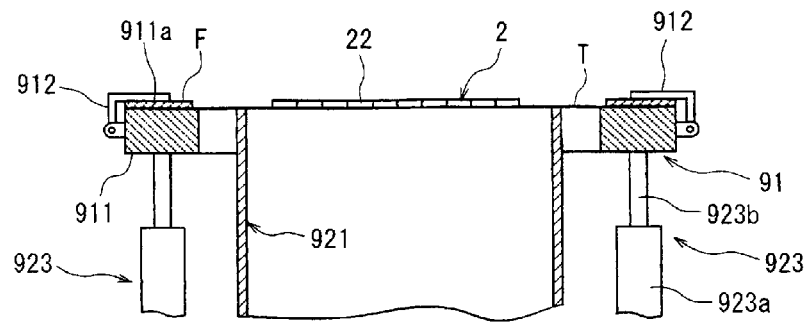
FIGS. 15A to 15C illustrate the picking-up step in the method of processing an optical device wafer according to the invention.
Figure 15B:
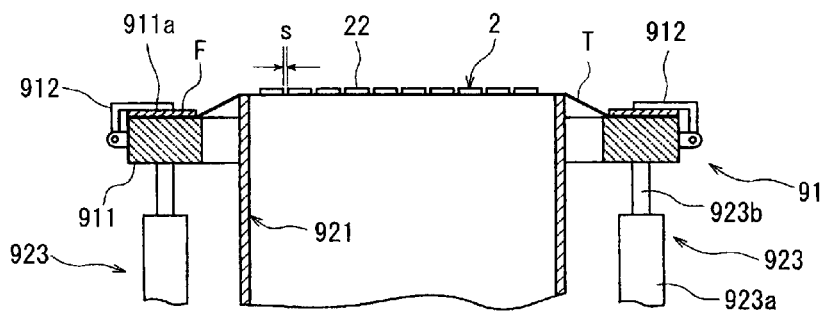

The tape expanding means 92 has an expansion drum disposed on the inside of the annular frame holding member 911. The expansion drum 921 has an inside diameter and an outside diameter which are smaller than the inside diameter of the annular frame F and larger than the outside diameter of the optical device wafer 2 adhered to the dicing tape T attached to the annular frame F. In addition, the expansion drum 921 has a support flange 922 at the lower end thereof. The tape expanding means 92, in the embodiment shown, has a support means 923 by which the annular frame holding member 911 can be advanced and retracted in the vertical direction. The support means is composed of a plurality of air cylinders 923a disposed on the support flange 922, and piston rods 923b thereof are connected to a lower surface of the annular frame holding member 911. The support means 923 thus composed of the plurality of air cylinders 923a moves the annular frame holding member 911 between a reference position where the mount surface 911a is at substantially the same height as the upper end of the expansion drum 921 as shown in FIG. 15A and an expansion position where the mount surface 911a is a predetermined amount lower than the upper end of the expansion drum 921 as shown in FIG. 15B.

Figure 15C:
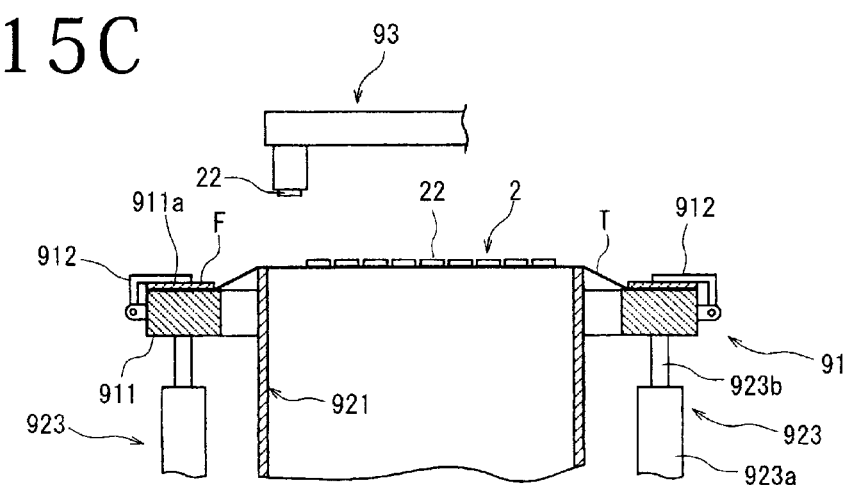

The picking-up step carried out using the picking-up device 9 configured as above will be described referring to FIGS. 15A to 15C. Specifically, the annular frame F to which the dicing tape T with the optical device wafer 2 (having been divided along the streets 21 into the individual optical device 22) adhered thereto is attached is mounted on the mount surface 911a of the frame holding member 911 constituting the frame holding means 91 as shown in FIG. 15A, and is fixed to the frame holding member 911 by the clamps 912. In this instance, the frame holding member 911 is positioned in the reference position shown in FIG. 15A. Next, the plurality of air cylinders 923a as the support means 923 constituting the tape expanding means 92 are operated so as to lower the annular frame holding member 911 to the expansion position shown in FIG. 15B. Therefore, the annular frame F fixed to the mount surface 911a of the frame holding member 911 is also lowered, so that dicing tape T attached to the annular frame F is brought into contact with the upper end edge of the expansion drum 921 and is expanded, as shown in FIG. 15B. As a result, the portions between the optical devices 22 adhered to the dicing tape T are widened, namely, the gaps S are enlarged. Subsequently, as shown in FIG. 15C, the pick-up collet 93 is operated to suck the optical device 22, to pick up the optical device 22 by peeling it from the dicing tape T, and to feeds the optical device 22 onto a tray (not shown). In the just-mentioned picking-up step, the gaps S between the optical devices 22 have been enlarged as above-mentioned, so that each optical device 22 can be easily picked up without interfering with the adjacent optical devices 22.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing an optical device wafer, for dividing an optical device wafer which has optical devices formed in a plurality of regions demarcated by a plurality of streets formed in a grid pattern on a face-side surface thereof, along said plurality of streets into the individual optical devices, said method comprising:
    a laser beam processing step of irradiating said optical device wafer with a laser beam along said streets so as to perform laser beam processing on the face side of said optical device wafer, thereby forming breakage starting points along said streets;
    a protective plate bonding step of bonding the face side of said optical device wafer having been subjected to said laser beam processing step to a surface of a rigid protective plate with a bonding agent permitting peeling;
    a back side grinding step of grinding a back side of said optical device wafer adhered to said protective plate to form said optical device wafer to a finished thickness of said optical devices;

a dicing tape adhering step of adhering the back-side surface of said optical device wafer having been subjected to said back side grinding step to a surface of a dicing tape;

a cut groove forming step of cutting said protective plate bonded to the face side of said optical device wafer having been subjected to said dicing tape adhering step, along said streets formed on said optical device wafer, thereby to form cut grooves not reaching said face-side surface of said optical device wafer;

a wafer dividing step of exerting an external force on said optical device wafer through said protective plate having been subjected to said cut groove forming step, so as to break up said optical device wafer along said breakage starting points formed along said streets, thereby dividing said optical device wafer into the individual optical devices;

a protective plate peeling step of peeling said protective plate bonded to the face side of said optical device wafer having been subjected to said wafer dividing step; and a picking-up step of picking up the individually divided optical devices adhered to said dicing tape.

2. The method of processing the optical device wafer according to claim 1, wherein said laser beam processing step comprises irradiating said optical device wafer with a laser beam having such a wavelength as to be transmitted through said optical device wafer while adjusting a focal point position of said laser beam to the inside of said optical device wafer, thereby to form an altered layer as said breakage starting points inside said optical device wafer along said streets.

3. The method of processing the optical device wafer according to claim 1, wherein said laser beam processing step comprises irradiating said optical device wafer with a laser beam having such a wavelength as to be absorbed in said optical device wafer, thereby to form laser beam-machined grooves as said breakage starting points in said face-side surface of said optical device wafer along said streets.

* * * * *